United States Patent
Shiratani et al.

(10) Patent No.: US 12,476,084 B2
(45) Date of Patent: Nov. 18, 2025

(54) PLASMA PROCESSING APPARATUS, HIGH-FREQUENCY POWER SUPPLY CIRCUIT, AND IMPEDANCE MATCHING METHOD

(71) Applicants: TOKYO ELECTRON LIMITED, Tokyo (JP); KYUSHU UNIVERSITY, NATIONAL UNIVERSITY CORPORATION, Fukuoka (JP)

(72) Inventors: Masaharu Shiratani, Fukuoka (JP); Kunihiro Kamataki, Fukuoka (JP); Kazunori Koga, Fukuoka (JP); Takahiro Shindo, Nirasaki (JP); Tatsuo Matsudo, Nirasaki (JP)

(73) Assignees: Tokyo Electron Limited, Tokyo (JP); Kyushu University, National University Corporation, Fukuoka (JP)

( * ) Notice: Subject to any disclaimer, the term of this patent is extended or adjusted under 35 U.S.C. 154(b) by 285 days.

(21) Appl. No.: 18/274,808

(22) PCT Filed: Jan. 19, 2022

(86) PCT No.: PCT/JP2022/001781
§ 371 (c)(1),
(2) Date: Jul. 28, 2023

(87) PCT Pub. No.: WO2022/163461
PCT Pub. Date: Aug. 4, 2022

(65) Prior Publication Data
US 2024/0120179 A1    Apr. 11, 2024

(30) Foreign Application Priority Data
Jan. 28, 2021   (JP) ................. 2021-012038

(51) Int. Cl.
*H01J 37/32*    (2006.01)
*H03H 11/44*   (2006.01)

(52) U.S. Cl.
CPC ....... *H01J 37/32183* (2013.01); *H03H 11/44* (2013.01); *H01J 2237/332* (2013.01); *H01J 2237/334* (2013.01)

(58) Field of Classification Search
None
See application file for complete search history.

(56) References Cited

U.S. PATENT DOCUMENTS 5,681,995 A  * 10/1997 Ooura ............... G01N 29/48
                                                        73/628
8,440,050 B2 *  5/2013 Iwata ............... H01J 37/32091
                                                        700/121

(Continued)

FOREIGN PATENT DOCUMENTS

JP    2011-124192 A    6/2011

OTHER PUBLICATIONS

PCT International Search Report, PCT Application No. PCT/JP2022/001781, Feb. 22, 2022, 8 pages (with English translation of International Search Report).

*Primary Examiner* — Srinivas Sathiraju
(74) *Attorney, Agent, or Firm* — Fenwick & West LLP

(57) ABSTRACT

There is provided a plasma processing apparatus for performing plasma processing on a substrate, comprising: a processing container accommodating the substrate; an electrode to which a high-frequency power for generating plasma in the processing container is applied; a high-frequency power supply configured to apply the high-frequency power to the electrode; and a high-frequency power supply circuit configured to supply the high-frequency power from the high-frequency power supply to the electrode. The high-frequency power supply circuit comprises: a (Continued)

power supply path configured to supply a power from the high-frequency power supply to the electrode; and a matching device configured to match a high-frequency power supply-side impedance with a plasma-side impedance, the matching device comprising a negative impedance portion that is connected to the power supply path and realizes a negative impedance corresponding to a plasma-side impedance.

20 Claims, 10 Drawing Sheets

(56) References Cited

U.S. PATENT DOCUMENTS

| | | | | |
|---|---|---|---|---|
| 11,476,089 | B2* | 10/2022 | Koshimizu | H01J 37/32128 |
| 11,742,181 | B2* | 8/2023 | Koshimizu | H01J 37/32183 315/111.21 |
| 11,990,317 | B2* | 5/2024 | Hasegawa | H01J 37/32183 |
| 2008/0008640 | A1* | 1/2008 | Watanabe | H01L 21/0245 257/E31.05 |
| 2009/0206058 | A1* | 8/2009 | Iwata | H01J 37/32027 156/345.35 |
| 2012/0315684 | A1* | 12/2012 | Hayashi | H01J 37/32 204/165 |
| 2019/0385815 | A1* | 12/2019 | Iwashita | H01J 37/32568 |
| 2020/0411286 | A1* | 12/2020 | Koshimizu | H01J 37/32091 |
| 2021/0327681 | A1* | 10/2021 | Koshimizu | H01J 37/32165 |
| 2022/0020568 | A1* | 1/2022 | Shindo | H01J 37/32568 |
| 2023/0167554 | A1* | 6/2023 | Matsudo | C23C 16/517 118/728 |
| 2023/0207264 | A1* | 6/2023 | Hasegawa | H01J 37/32174 307/52 |
| 2023/0250530 | A1* | 8/2023 | Kikuchi | C23C 16/5096 427/576 |
| 2023/0307215 | A1* | 9/2023 | Matsudo | H01L 21/31 |
| 2023/0411118 | A1* | 12/2023 | Matsudo | H01L 21/3065 |
| 2024/0120179 | A1* | 4/2024 | Shiratani | H01J 37/32183 |

* cited by examiner

10MHz + 5MHz

PLASMA PROCESSING APPARATUS, HIGH-FREQUENCY POWER SUPPLY CIRCUIT, AND IMPEDANCE MATCHING METHOD

TECHNICAL FIELD

The present disclosure relates to a plasma processing apparatus, a high-frequency power supply circuit, and an impedance matching method.

BACKGROUND

A plasma processing apparatus is often used in a semiconductor manufacturing process. The plasma processing apparatus generates plasma in a chamber accommodating a substrate to be processed by supplying a high-frequency power to a plasma processing part having the chamber, and performs plasma processing such as etching, film formation, or the like using the plasma.

In this plasma processing apparatus, it is necessary to match a power supply-side impedance and a load-side (plasma-side) impedance in order to efficiently supply a high-frequency power from a high-frequency power supply to the plasma processing part during processing. From this point of view, a technique in which an impedance matching device including two variable passive devices (for example, variable capacitors) is disposed between a high-frequency power supply and a plasma processing part (see, for example, Patent Document 1) is used.

PRIOR ART DOCUMENTS

Patent Documents

Patent Document 1: Japanese Laid-open Patent Publication No. 2011-124192

SUMMARY

Problems to Be Resolved by the Invention

The present disclosure provides a technology capable of matching a high-frequency power supply-side impedance with a plasma-side (load-side) impedance in a wide frequency band.

Means for Solving the Problems

In accordance with an aspect of the present disclosure, there is provided a plasma processing apparatus for performing plasma processing on a substrate, comprising: a processing container accommodating the substrate; an electrode to which a high-frequency power for generating plasma in the processing container is applied; a high-frequency power supply configured to apply the high-frequency power to the electrode; and a high-frequency power supply circuit configured to supply the high-frequency power from the high-frequency power supply to the electrode, wherein the high-frequency power supply circuit includes: a power supply path configured to supply a power from the high-frequency power supply to the electrode; and a matching device configured to match a high-frequency power supply-side impedance with a plasma-side impedance that is a load, the matching device including a negative impedance portion that is connected to the power supply path and realizes a negative impedance corresponding to a plasma-side impedance.

Effect of the Invention

In accordance with the present disclosure, a technology capable of matching a high-frequency power supply-side impedance with a plasma-side (load-side) impedance in a wide frequency band is provided.

DETAILED DESCRIPTION

Hereinafter, embodiments will be described in detail with reference to the accompanying drawings.

Figure 1:
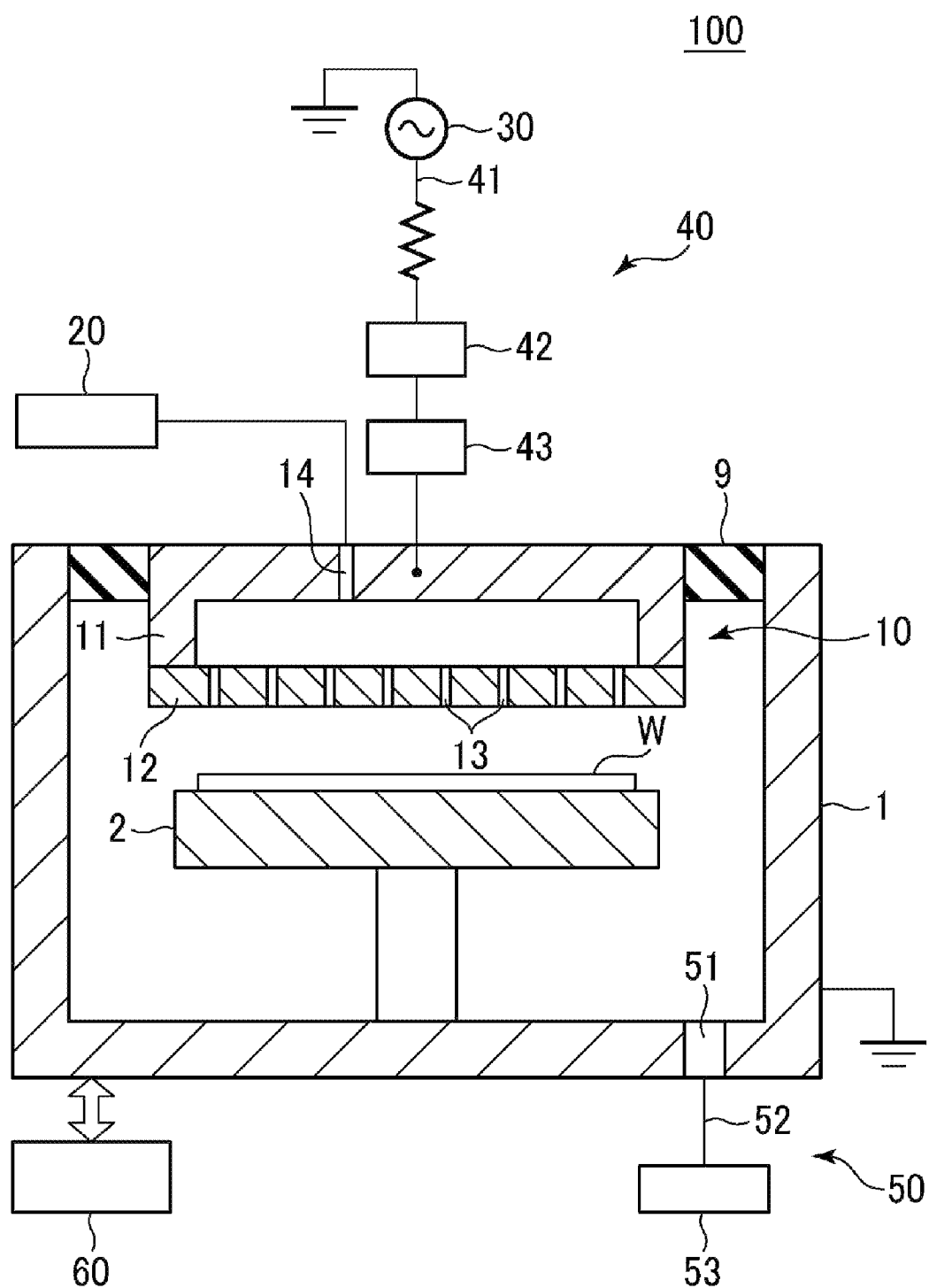
FIG. 1 is a cross-sectional view schematically illustrating a plasma processing apparatus according to a first embodiment.

FIG. 1 is a cross-sectional view schematically illustrating a plasma processing apparatus according to a first embodiment.

A plasma processing apparatus 100 performs plasma processing on a substrate W, and is configured as a capacitively coupled plasma processing apparatus. The substrate W may be, e.g., a semiconductor wafer, but is not limited thereto.

The plasma processing apparatus 100 includes a substantially cylindrical processing container (chamber) 1 made of a metal. The processing container 1 is grounded. A substrate support 2 for horizontally placing a substrate W is disposed in the processing container 1. The substrate support 2 includes a grounded lower electrode. In an illustrated example, the substrate support 2 is made of a metal, functions as a lower electrode, and is grounded. The substrate support 2 may be made of an insulator. In that case, the substrate support 2 may have a structure in which a grounded lower electrode made of a metal is embedded therein. The lower electrode can be grounded through an impedance adjustment circuit that may have a variable capacitor and/or inductor.

The substrate support 2 may be provided with a heating mechanism or a cooling mechanism depending on plasma processing. A plurality of lift pins (not shown) are inserted into the substrate support 2 to protrude from the upper surface thereof. The substrate W is transferred to and from the substrate support 2 by lifting operation of the plurality of lift pins of a lift mechanism (not shown).

An opening is formed in the upper portion of the processing container 1, and a shower head 10 is fitted in the opening to face the substrate support 2 via an insulating member 9. The shower head 10 is made of a metal, has a cylindrical overall shape, and includes an upper electrode. In the illustrated example, the shower head 10 functions as the upper electrode. However, a part of the shower head 10 may serve as the upper electrode. The shower head 10 has a main body 11 having an opening at a bottom portion thereof, and a shower plate 12 disposed to block the opening of the main body 11, and the inner space therebetween functions as a gas diffusion space. A plurality of gas injection holes 13 are formed in the shower plate 12.

A gas inlet hole 14 is formed in the shower head 10, and a processing gas for plasma processing supplied from a gas supply part 20 is introduced into the shower head 10 through the gas inlet hole 14. Then, the processing gas introduced into the shower head 10 is discharged into the processing container 1 from the gas injection holes 13, and is supplied into the space between the shower head 10 serving as the upper electrode and the substrate support 2 serving as the lower electrode.

The gas supply part 20 is configured to supply a plurality of gases required for plasma processing, such as a processing gas, a plasma generating gas, a purge gas, and the like. The processing gas is appropriately selected depending on plasma processing to be performed. The gas supply part 20 has a plurality of gas supply sources and a plurality of gas supply paths. The gas supply paths are provided with valves and flow rate controllers such as mass flow controllers.

An exhaust port 51 is disposed at the bottom wall of the processing container 1, and an exhaust device 53 is connected to the exhaust port 51 through an exhaust line 52. The evacuation device 53 has an automatic pressure control valve and a vacuum pump. The evacuation device 53 evacuates the inside of the processing chamber 1, and the pressure in the processing container 1 can be maintained at a desired vacuum level.

Although not shown, a loading/unloading port for loading/unloading the substrate W to/from the processing container 1 is formed in the sidewall of the processing container 1. The loading/unloading port is configured to be opened and closed by a gate valve.

A high-frequency power supply 30 is connected to substantially the center of the shower head 10 serving as the upper electrode via a high-frequency power supply circuit 40. The high-frequency power is supplied from the high-frequency power supply 30 to the shower head 10 serving as the upper electrode, thereby generating capacitively coupled plasma between the shower head 10 serving as the upper electrode and the substrate support 2 serving as the lower electrode. The frequency of the high-frequency power supply 30 is preferably within a range of 0.1 MHz to 1000 MHz.

The high-frequency power supply circuit 40 includes a power supply path 41 from the high-frequency power supply 30, a negative impedance portion 42 that is a matching device, and a boosting or amplifying part 43.

The power supply path 41 is connected from the high-frequency power supply 30 to the shower head 10 serving as the upper electrode. The negative impedance portion 42 is connected to the power supply path 41 and functions as a matching device for realizing a negative impedance corresponding to the impedance of the plasma (load) generated in the processing container (chamber) 1 and matching the power supply-side impedance with the load-side impedance. The negative impedance portion 42 has a negative impedance corresponding to the impedance of the plasma that is the load, and thus functions to cancel the impedance of the plasma that is the load as well as the frequency characteristics.

The negative impedance portion 42 may be formed of a negative impedance conversion circuit, or may be formed of a metamaterial.

The negative impedance conversion circuit indicates a circuit that realizes a negative impedance. The metamaterial is an artificial material in which electromagnetic properties of the material are artificially manipulated by integrating structures smaller than the wavelength of electromagnetic waves. The metamaterial can realize behaviors that are not found in materials in the natural world for electromagnetic waves. In this example, the metamaterial is configured to realize a negative impedance.

The boosting or amplifying part 43 is disposed at the downstream of the negative impedance portion 42 of the power supply path 41, and has a function of outputting the output of the negative impedance portion 42 at a high voltage. The boosting or amplifying part 43 may be a booster for boosting a voltage or an amplifier for amplifying a power. A boosting circuit using a step-up transformer can be used as the booster, and an amplifier circuit using a transistor can be used as the amplifier.

Figure 2:
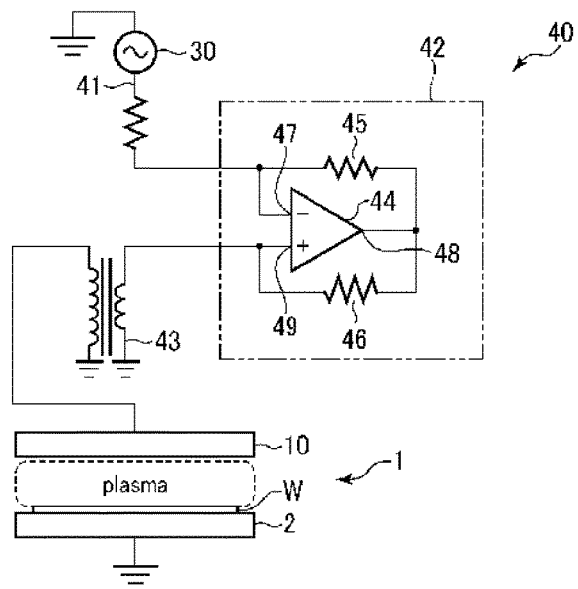
FIG. 2 is a configuration illustrating a specific example in which a negative impedance conversion circuit is used as a negative impedance portion and a step-up transformer is used as an amplifier in the plasma processing apparatus according to the first embodiment.

A specific example of the high-frequency power supply circuit 40 is shown in FIG. 2. FIG. 2 shows an example in which a negative impedance conversion circuit is used as the negative impedance portion 42 and a booster including a step-up transformer is used as the boosting or amplifying part 43. In this example, the negative impedance conversion circuit as the negative impedance portion 42 includes an operational amplifier 44 and two resistors 45 and 46. An inverting input terminal 47 of the operational amplifier 44 is connected to the power supply path 41 from the high-frequency power supply 30. The output from the output terminal 48 of the operational amplifier 44 is inputted again to the inverting input terminal 47 via the resistor 45 and also is inputted to the non-inverting input terminal 49 via the resistor 46. Further, the non-inverting input terminal 49 is connected to the step-up transformer of the booster constituting the boosting or amplifying part 43.

The negative impedance conversion circuit (the negative impedance portion 42) of FIG. 2 is configured to negatively invert the impedance of the plasma generated between the shower head 10 serving as the upper electrode and the substrate support 2 serving as the lower electrode. The sizes of the resistors 45 and 46 and the operational amplifier 44 are appropriately set to have intended functions. Another impedance element such as a capacitor, a coil, or the like may be used instead of the resistors 45 and 46.

The negative impedance conversion circuit is not limited to one using an operational amplifier as shown in FIG. 2, and various conventionally known circuits such as a circuit using a transistor and the like can be used.

The valve or the flow rate controller of the gas supply part 20, the high-frequency power supply, and the like, which are the components of the plasma processing apparatus 100, are controlled by a controller 60. The controller 60 includes a main controller having a CPU, an input device, an output device, a display device, and a storage device. The processing of the plasma processing apparatus 100 is controlled based on a processing recipe stored in a storage medium of the storage device.

Next, the operation of the plasma processing apparatus 100 configured as above will be described.

First, a gate valve (not shown) is opened, and the substrate W is loaded into the processing container 1 through the loading/unloading port and placed on the substrate support 2 by a transfer device (not shown). The transfer device retracts, and the gate valve is closed.

Then, the pressure in the processing container 1 is adjusted, and the high-frequency power is supplied from the high-frequency power supply 30 to the shower head 10 serving as the upper electrode via the high-frequency power supply circuit 40 in a state where a processing gas is introduced into the processing container 1. Accordingly, high-frequency electric field is generated between the shower head 10 serving as the upper electrode and the substrate support 2 serving as the lower electrode, and capacitively coupled plasma is generated therebetween. The plasma processing such as film formation or the like is performed on the substrate W using the plasma thus generated.

Figure 3:
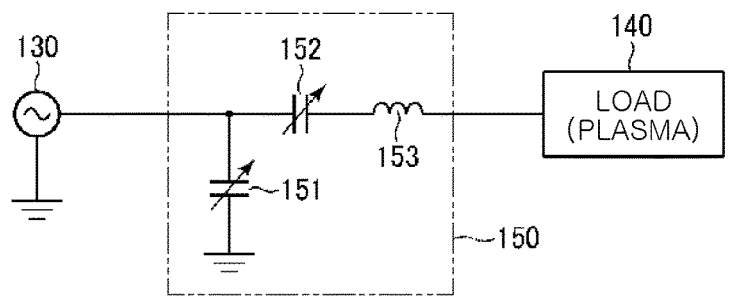
FIG. 3 is a circuit diagram illustrating an example of a conventional matching device.

When the high-frequency power is inputted to the load (plasma), it is necessary to match the impedance on the power supply side with the impedance on the load side. When the matching is not performed, the power is not sufficiently inputted to the load, and is reflected to the power supply side. Therefore, conventionally, an impedance matching device including two variable passive elements, which is disclosed in Patent Document 1, was used. Specifically, conventionally, as shown in FIG. 3, for example, the impedance on the power supply side and the impedance on the load (plasma) side were matched by providing a matching device 150 having two variable capacitors 151 and 152 and a coil 153 between a high-frequency power supply 130 and a load (plasma) 140.

Figure 4:
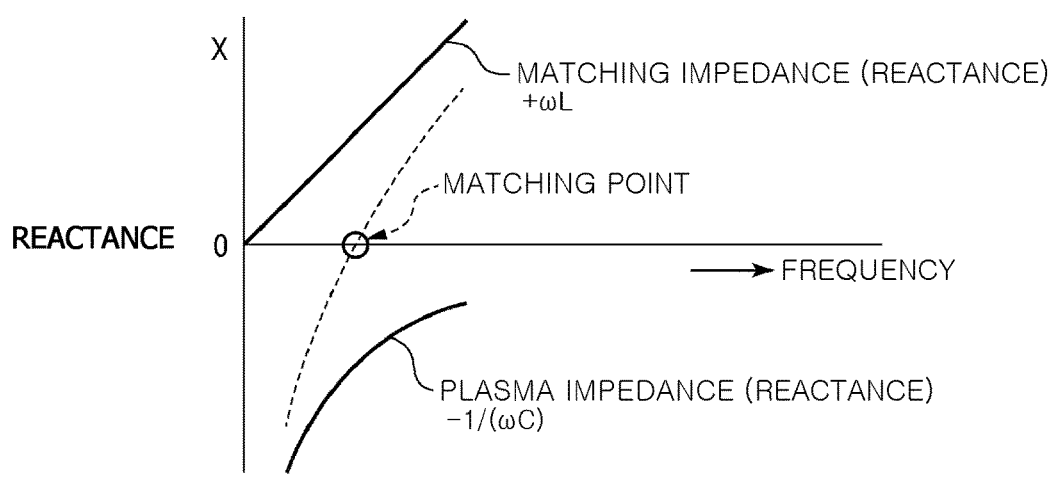
FIG. 4 is a diagram explaining impedance matching in the case of using the conventional matching device.

However, in the case of the conventional matching device, the matching with the impedance (reactance) of the plasma can be performed only at a certain frequency point as shown in FIG. 4.

If an arbitrary voltage waveform such as a square wave or a sawtooth wave can be applied to the plasma, it is possible to control ion energy distribution or electron energy distribution. Since, however, the square wave or the sawtooth wave has a plurality of frequency components, it is not possible to perform matching by the conventional matching technique.

Figure 5:
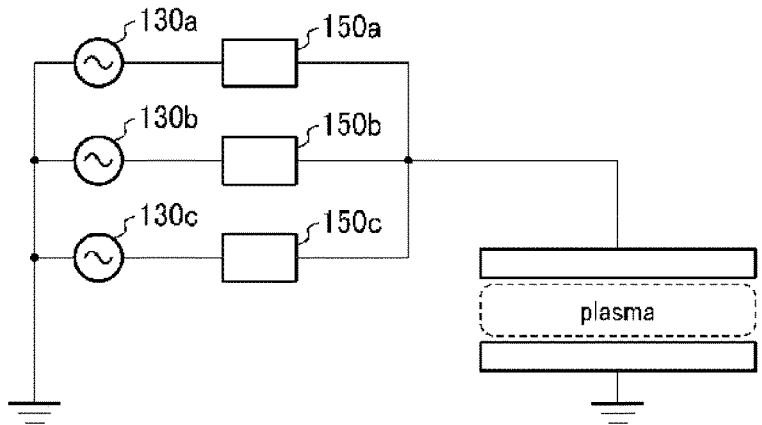
FIG. 5 is a diagram illustrating a device configuration in the case of generating plasma by inputting high-frequency powers having a plurality of frequencies using a conventional matching technique.

Further, in the case of generating plasma by applying high-frequency powers having a plurality of frequencies to the processing container (chamber), in the conventional matching technique, it is necessary to provide matching devices 150a, 150b, and 150c respectively corresponding to the high-frequency power supplies 130a, 130b, and 130c, as shown in FIG. 5, which results in scaling up of a system and a cost increase.

Figure 6:
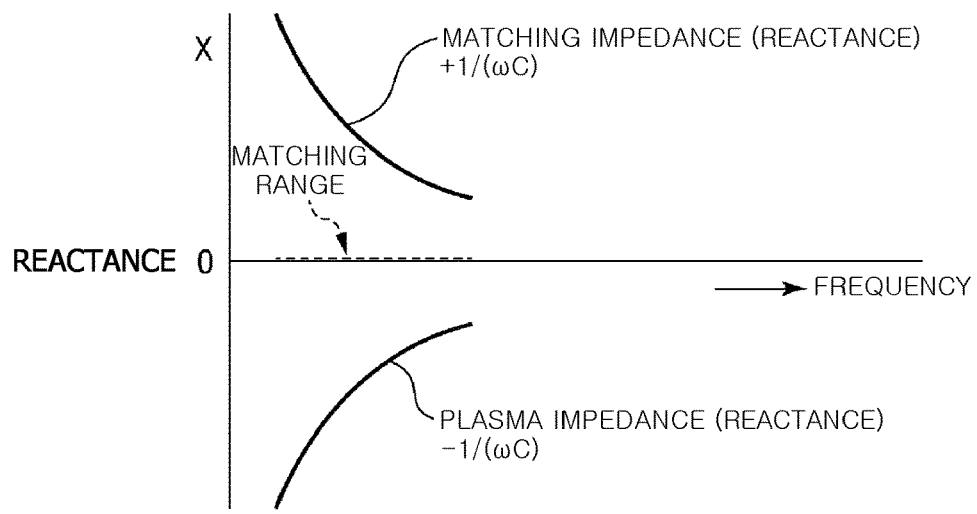
FIG. 6 a diagram explaining impedance matching in the case of using a matching device of the first embodiment.

On the other hand, in the present embodiment, by providing the negative impedance portion 42 that realizes a negative impedance corresponding to the plasma impedance, it is possible to cancel the plasma impedance (reactance) including the frequency characteristics, as shown in FIG. 6. Therefore, it is theoretically possible to match the impedance at all frequencies, and also possible to match the power supply-side impedance with the load-side impedance in a wide frequency band.

Figure 7:
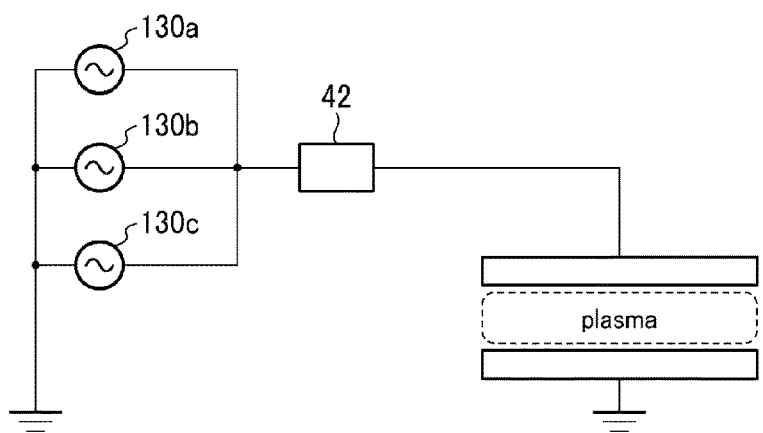
FIG. 7 is a diagram illustrating a case of inputting high-frequency powers having a plurality of frequencies from high-frequency power supplies having a plurality of frequencies using a high-frequency power supply circuit of the first embodiment.

Since the impedance matching can be performed in a wide frequency band, the matching can be performed even for a rectangular wave or a sawtooth wave having a plurality of frequency components. Even when the high-frequency power supplies 130a to 130c having a plurality of frequencies are provided to input the high-frequency powers having a plurality of frequencies to the processing container (chamber) as shown in FIG. 7, one negative impedance portion 42 may be provided, and the scaling up of the system and the cost increase do not occur.

The negative impedance conversion circuit constituting the negative impedance portion 42 is known, but is intended for low voltage applications such as a communication field, and there is no example of application to high voltage applications such as plasma ignition. For example, in the negative impedance conversion circuit using the operational amplifier as shown in FIG. 2, a general-purpose operational amplifier uses an element driven by a low voltage of 15V or less, so that it is difficult to deal with plasma ignition requiring a high voltage of 50V or higher.

On the other hand, in the present embodiment, the high-frequency power supply circuit 40 has a configuration in which the boosting or amplifying part 43 is disposed at the subsequent stage of the negative impedance portion 42 constituting the matching device/device. Hence, even if the output voltage of the negative impedance portion 42 is small, it is possible to secure a voltage necessary for plasma ignition.

Figure 8:
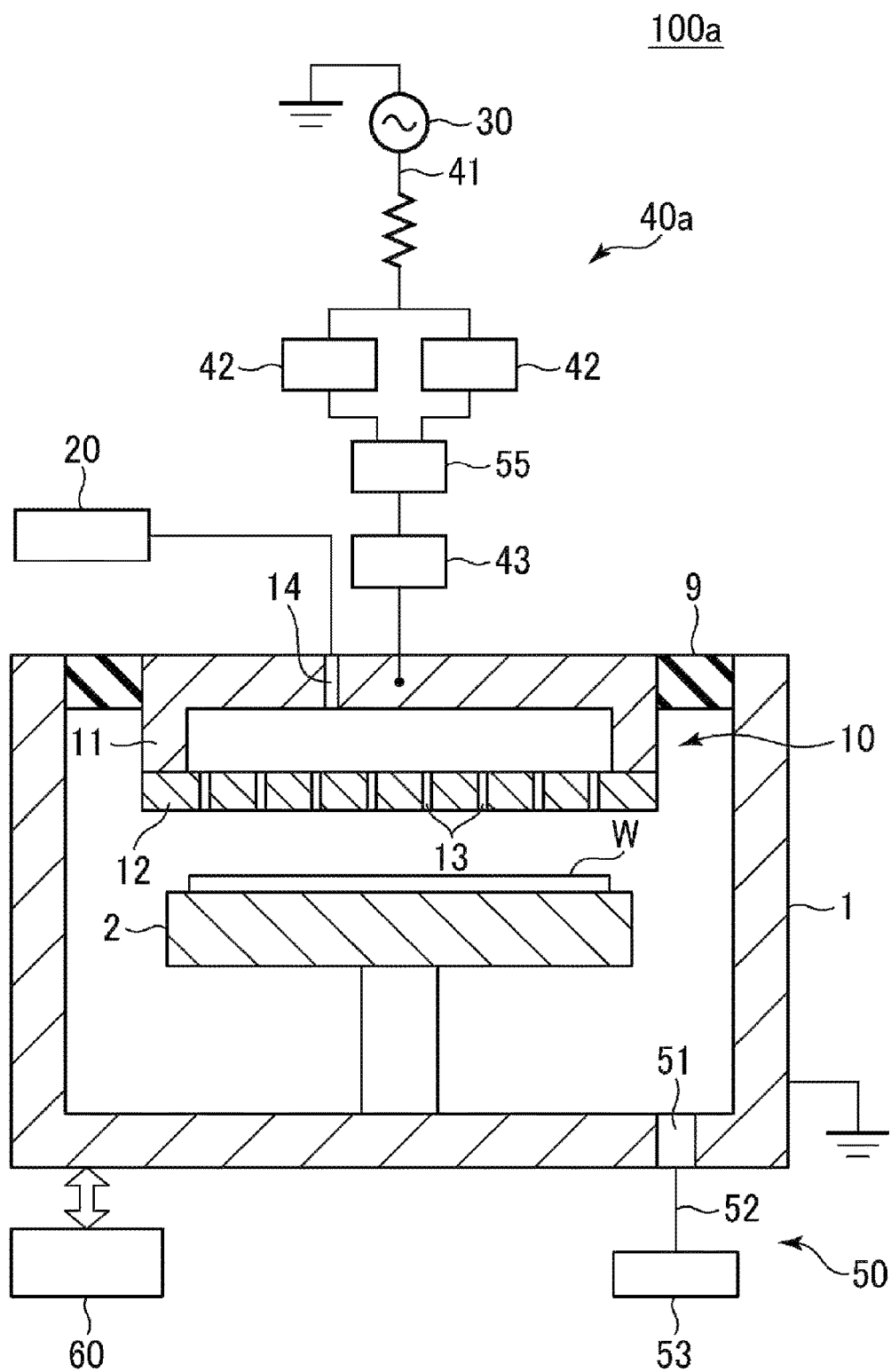
FIG. 8 is a cross-sectional view schematically illustrating a plasma processing apparatus according to a second embodiment.

FIG. 8 is a cross-sectional view schematically illustrating a plasma processing apparatus according to a second embodiment.

A plasma processing apparatus 100a of the present embodiment includes, instead of the high-frequency power supply circuit 40 of the first embodiment, a high-frequency power supply circuit 40a including a matching device having a plurality of negative impedance portions 42 and a combiner 55 for combining outputs of the plurality of negative impedance portions 42. In the plasma processing apparatus 100a of FIG. 8, like reference numerals will be used for like parts as those of the plasma processing apparatus 100 of FIG. 1, and redundant description thereof will be omitted.

In the plasma processing apparatus 100a of the present embodiment, the high-frequency power from the high-frequency power supply 30 is supplied to the plurality of negative impedance portions 42, and the outputs from the plurality of negative impedance portions 42 are combined by the combiner 55 to increase the input power. After the outputs are combined, the output is boosted by the booster used as the boosting or amplifying part 43, as in the first embodiment. By using the plurality of negative impedance portions 42 in addition to the voltage increase using the booster constituting the boosting or amplifying part 43, it is possible to secure a sufficient power. For example, a voltage of 25 V to 2 kV and a combined power of 0.1 W to 50 kW can be applied to the shower head 10. By increasing the voltage and the power, the plasma ignition can be performed more easily.

Figure 9:
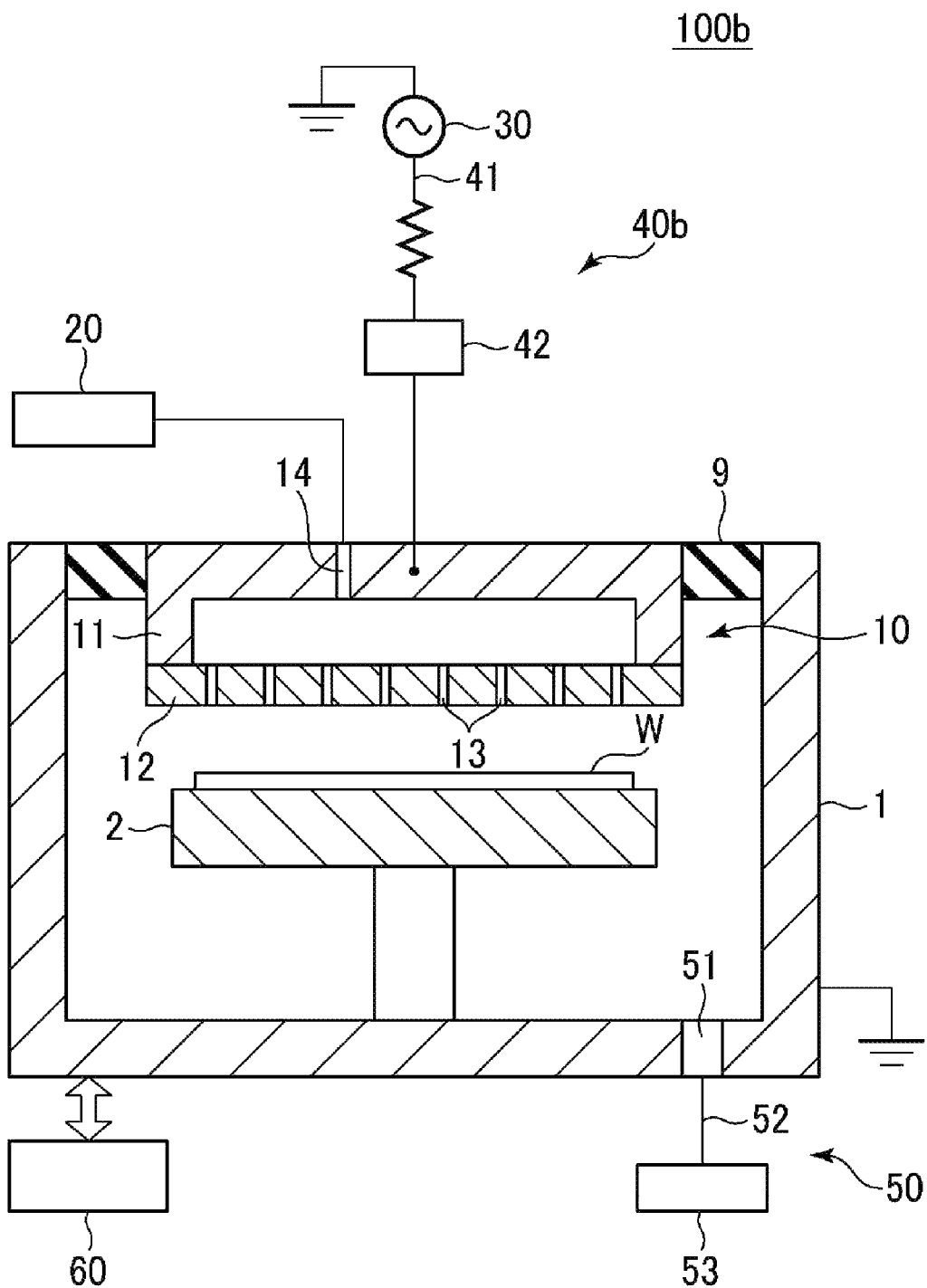
FIG. 9 is a cross-sectional view schematically illustrating a plasma processing apparatus according to a third embodiment.

FIG. 9 is a cross-sectional view schematically illustrating a plasma processing apparatus according to a third embodiment.

A plasma processing apparatus 100b of the present embodiment includes a high-frequency power supply circuit 40b obtained by removing the boosting or amplifying part 43 from the high-frequency power supply circuit 40 of the first embodiment. In the plasma processing apparatus 100b of FIG. 9, like reference numerals will be used for like parts as those of the plasma processing apparatus 100 of FIG. 1, and redundant description thereof will be omitted.

In the plasma processing apparatus 100b of the present embodiment, the output voltage of the negative impedance portion 42 constituting the matching device is set to a voltage at which plasma can be ignited, and the negative impedance portion 42 is directly connected to the shower head 10 serving as the upper electrode.

As described above, the negative impedance conversion circuit constituting the negative impedance portion 42 is intended for low-voltage applications such as the communication field, and there is no example of application to high-voltage applications such as plasma ignition. For example, in a negative impedance conversion circuit using an operational amplifier, a general-purpose operational amplifier uses an element driven at a low voltage of 15 V or less, so it is difficult to deal with plasma ignition requiring a high voltage of 50 V or higher. Therefore, in the first embodiment and the second embodiment, a booster such as a step-up transformer is used as the boosting or amplifying part 43.

However, if the negative impedance portion 42 constituting the matching device is configured to output a voltage at which plasma can be ignited, the boosting or amplifying part 43 becomes unnecessary. Therefore, in the present embodiment, the high-frequency power supply circuit is configured as follows so that the boosting or amplifying part 43 may not be used.

Figure 10:
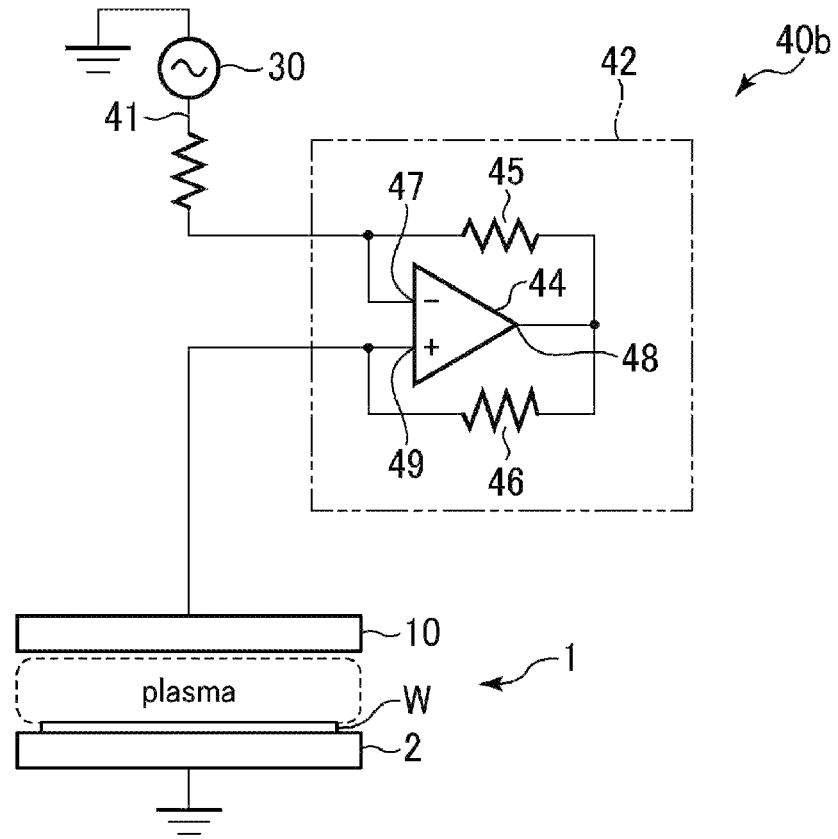
FIG. 10 is a configuration illustrating a specific example using a negative impedance conversion circuit as a negative impedance portion in the plasma processing apparatus according to the third embodiment.

For example, when the negative impedance portion 42 is formed of a negative impedance conversion circuit having the operational amplifier 44 as shown in FIG. 10, an output voltage at which plasma can be ignited can be realized by using an operational amplifier 44 for high-voltage applications instead of a general-purpose operational amplifier.

Figure 11:
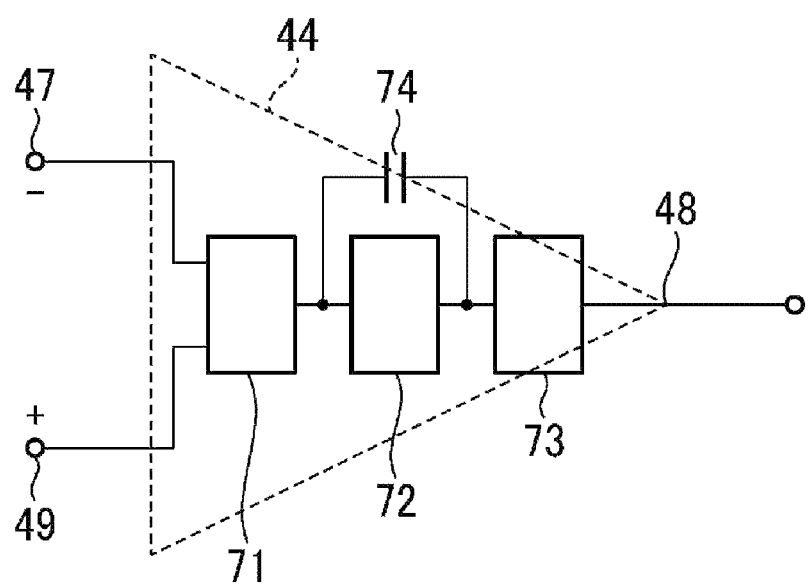
FIG. 11 is a diagram illustrating a structure example of an operational amplifier used in a negative impedance conversion circuit.
Figure 12:
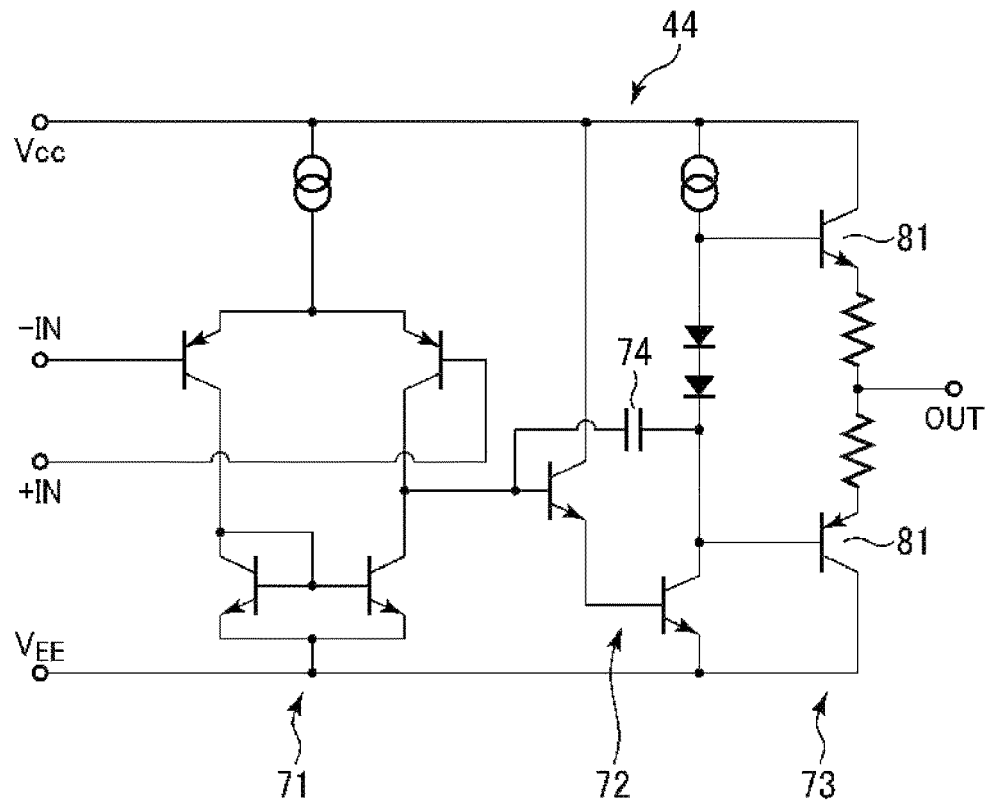
FIG. 12 is a diagram illustrating a specific circuit example of the operational amplifier used in the negative impedance conversion circuit.

As shown in FIG. 11, the operational amplifier 44 has an input stage 71, a gain stage 72, and an output stage 73. A specific circuit is a combination of a plurality of transistors, and has a configuration as shown in FIG. 12, for example. The input stage 71 is an operational amplifying stage that amplifies a differential voltage between the inverting input terminal 47 and the non-inverting input terminal 49 and cancels the in-phase signal component without amplifying it. The gain stage 72 increases the open gain of the operational amplifier 44. A phase compensation capacitor 74 for preventing oscillation is connected to the gain stage 72. The output stage 73 is a push-pull circuit having a plurality of transistors 81 and the output voltage is determined by the transistors 81. Therefore, the transistor 81 is a transistor which can output a high voltage at which plasma can be ignited at the high frequency used in the present embodiment. The high-performance transistor capable of performing a high-frequency operation at a high voltage may be made of, e.g., GaN, $Ga_2O_3$, diamond, or the like.

Figure 13:
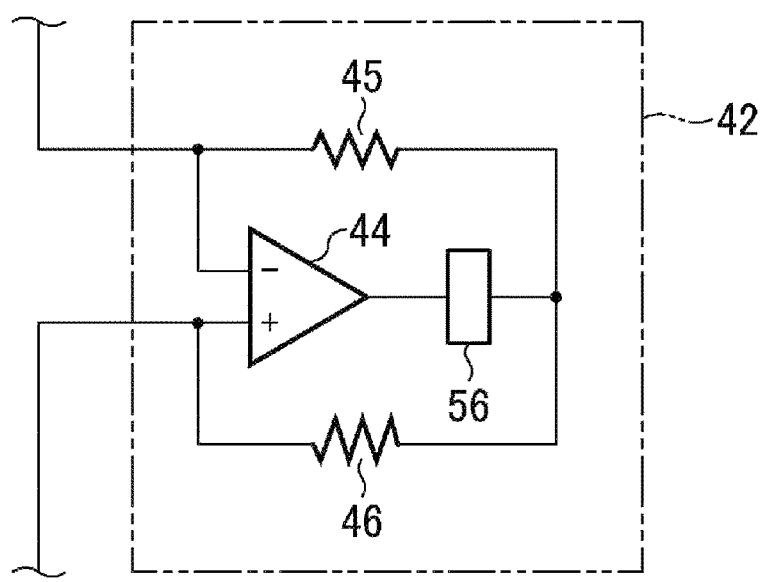
FIG. 13 is a diagram illustrating a modification of the negative impedance conversion circuit used as the negative impedance portion in the plasma processing apparatus according to the third embodiment.

Further, as shown in FIG. 13, the negative impedance portion 42 may be a negative impedance conversion circuit in which the general-purpose operational amplifier 44 is used, and a booster circuit 56 such as a transistor circuit that realizes a high voltage at which plasma can be ignited is connected to the subsequent stage thereof.

Figure 14:
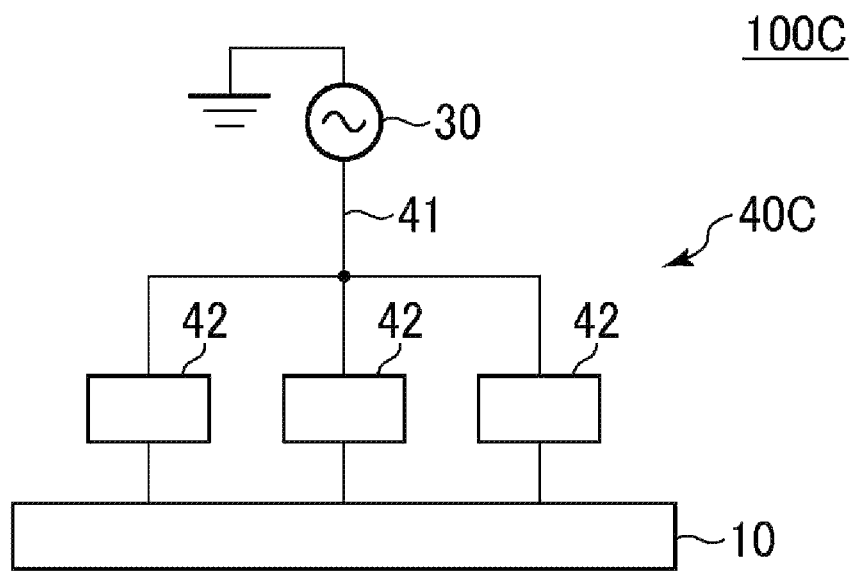
FIG. 14 is a cross-sectional view schematically illustrating main components of a plasma processing apparatus according to a fourth embodiment.

FIG. 14 is a cross-sectional view schematically illustrating main parts of a plasma processing apparatus according to a fourth embodiment.

A plasma processing apparatus 100c of the present embodiment includes a high-frequency power supply circuit 40c having a plurality of negative impedance portions 42 of the third embodiment, and the negative impedance portions 42 are connected to the shower head 10 without being connected to an amplifier. In the plasma processing apparatus 100c of FIG. 14, like reference numerals will be given to like parts as those of the plasma processing apparatus 100 of FIG. 1, and redundant description thereof will be omitted.

Figure 15:
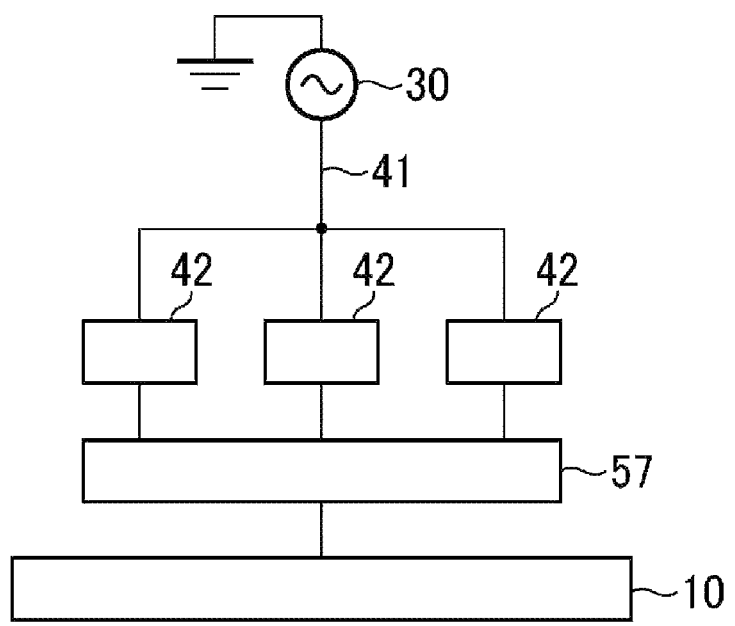
FIG. 15 is a diagram illustrating a modification of the high-frequency power supply circuit in the plasma processing apparatus of FIG. 14.

In the example of FIG. 14, the power supply paths extending from the plurality of negative impedance portions 42 are connected to the shower head 10 serving as the upper electrode, so that the power is supplied at multiple points. As shown in FIG. 15, the outputs from the plurality of negative impedance portions 42 may be combined by the combiner 57, so that the power may be supplied at one point to the shower head 10 serving as the upper electrode.

By providing the plurality of negative impedance portions 42, the power can be increased compared to the third embodiment in which one negative impedance portion 42 is provided.

Figure 16:
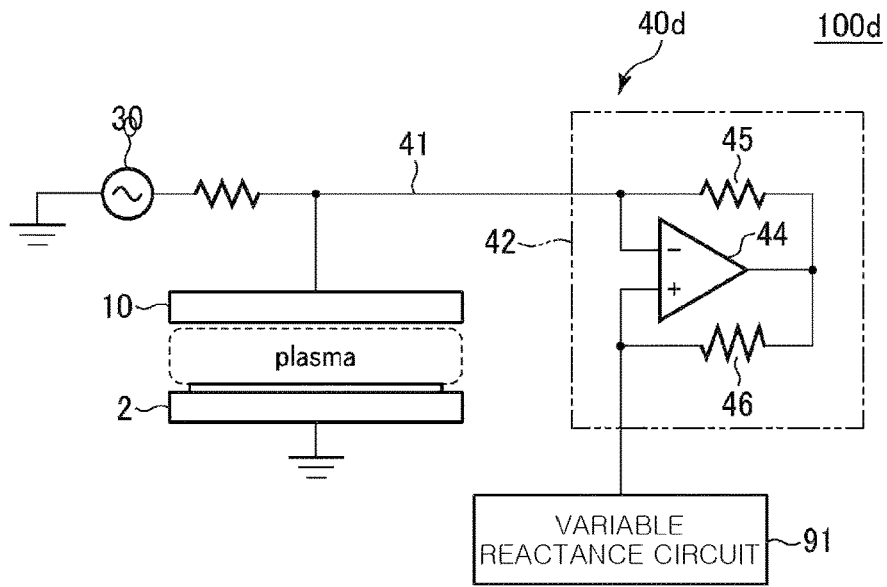
FIG. 16 is a cross-sectional view schematically illustrating main components of a plasma processing apparatus according to a fifth embodiment.

FIG. 16 is a configuration diagram schematically illustrating a plasma processing apparatus according to a fifth embodiment.

A plasma processing apparatus 100d of the present embodiment can adjust the impedance of the matching device including the negative impedance portion 42. When the impedance of the plasma that is a load varies little, it is not required to adjust the impedance of the matching device including the negative impedance portion 42. However, when the impedance of the plasma varies significantly due to the changes in the conditions of the plasma, the adjustment may be required.

The plasma processing apparatus 100d of the present embodiment includes a high-frequency power supply circuit 40d having a matching device formed of the negative impedance portion 42 and a variable reactance circuit 91 serving as an impedance adjustment part. FIG. 16 shows an example using a negative impedance conversion circuit having the operational amplifier 44 shown in FIG. 2 as the negative impedance portion 42.

The variable reactance circuit 91 has a variable coil and/or a variable capacitor, and is connected to the negative impedance conversion circuit constituting the negative impedance portion 42.

In the present embodiment, the impedance of the matching device is adjusted by the variable reactance circuit 91 depending on the changes in the conditions of the plasma generated in the processing container 1. Accordingly, even if the plasma impedance varies, the power supply-side impedance can be matched with the plasma-side (load-side) impedance.

Figure 17:
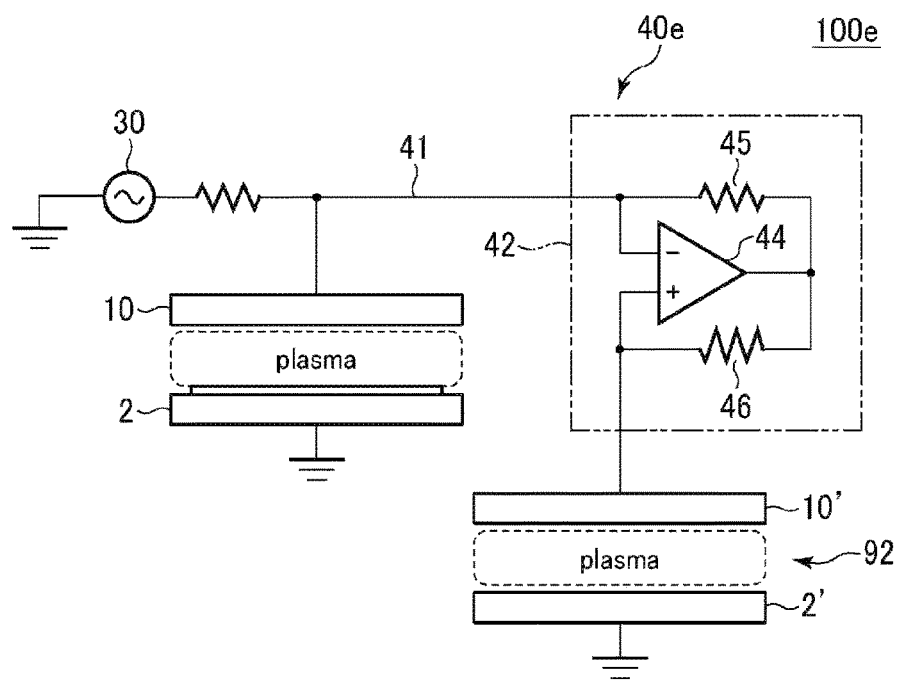
FIG. 17 is a cross-sectional view schematically illustrating main components of a plasma processing apparatus according to a sixth embodiment.

FIG. 17 is a configuration diagram schematically illustrating a plasma processing apparatus according to a sixth embodiment.

In a plasma processing apparatus 100e of the present embodiment, as in the fifth embodiment, the impedance of the matching device including the negative impedance portion 42 can be adjusted, so that it is possible to deal with the case where the impedance of the plasma varies significantly.

The plasma processing apparatus 100e of the present embodiment includes a high-frequency power supply circuit 40e having a matching device formed of the negative impedance portion 42 and a plasma generation part 92 serving as an impedance adjustment part. FIG. 17 also shows an example using a negative impedance conversion circuit having an operational amplifier 44 shown in FIG. 2 as the negative impedance portion 42.

The plasma generation part 92 has an upper electrode 10' and a lower electrode 2'. The plasma generation part 92 generates plasma using the same recipe as that used when the plasma is generated in the processing container 1. The plasma generation part 92 is connected to the negative impedance conversion circuit constituting the negative impedance portion 42.

As described above, in the present embodiment, the plasma generation part 92 for generating plasma using the same recipe as that used when the plasma is generated in the processing container 1 is connected to the negative impedance conversion circuit constituting the negative impedance portion 42. Accordingly, the same impedance as the impedance of the plasma generated in the processing container 1 is negatively inverted by the negative impedance conversion circuit and becomes the impedance of the matching device. Therefore, the impedance of the matching device can cancel the impedance of the plasma in the processing container 1, and even if the impedance of the plasma varies, the impedance of the power supply side can be matched with the impedance of the plasma that is the load.

Figure 18:
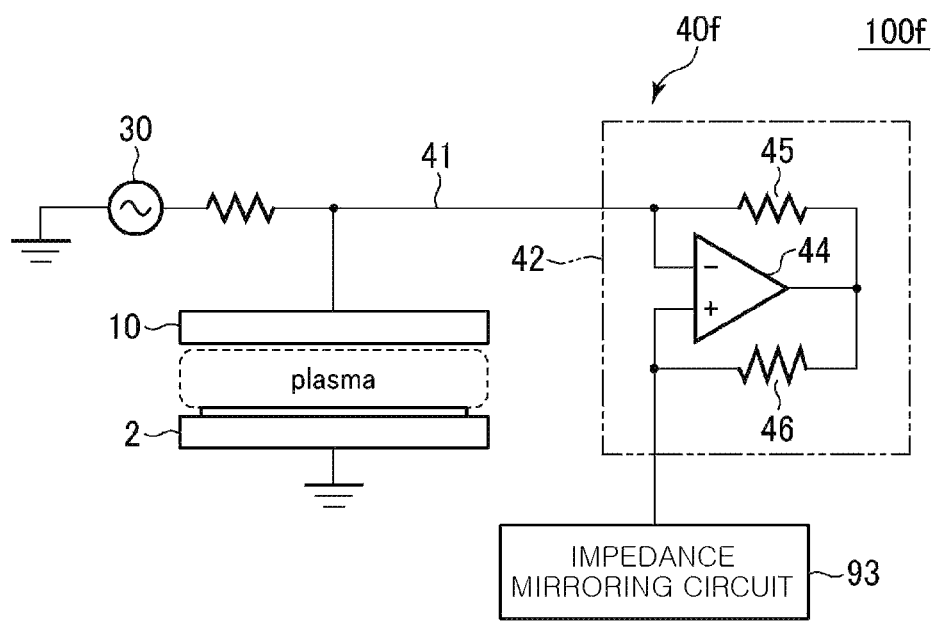
FIG. 18 is a cross-sectional view schematically illustrating main components of a plasma processing apparatus according to a seventh embodiment.

FIG. 18 is a configuration diagram schematically illustrating a plasma processing apparatus according to a seventh embodiment.

Similarly to the fifth and sixth embodiments, a plasma processing apparatus 100f of the present embodiment can deal with the case where the impedance of the plasma varies significantly by adjusting the impedance of the matching device including the negative impedance portion 42.

The plasma processing apparatus 100f of the present embodiment includes a high-frequency power supply circuit 40f having a matching device formed of the negative impedance portion 42 and an impedance mirroring circuit 93 serving as an impedance adjustment part. FIG. 18 shows an example using a negative impedance conversion circuit having the operational amplifier 44 as shown in FIG. 2 as the negative impedance portion 42.

The impedance mirroring circuit 93 has an active element such as an operational amplifier, is adjusted in impedance so as to realize the same impedance as the plasma in the processing container 1, and is connected to the negative impedance conversion circuit constituting the negative impedance portion 42.

Therefore, the impedance of the impedance mirroring circuit 93 that is the same as that of the plasma in the processing container 1 is negatively inverted by the negative impedance conversion circuit and becomes the impedance of the matching device. Therefore, the impedance of the matching device can cancel the impedance of the plasma in the processing container 1, and even if the impedance of the plasma varies, the impedance on the power supply side can be matched with the impedance of the plasma that is the load.

Next, test results will be described.

First, the power reflection of the negative impedance conversion circuit shown in FIG. 2 was measured using a network analyzer. As a result, it was confirmed that a reflection ratio S11 represented by an S parameter corresponding to a reflected power was −10 dB or less (the reflection of the power was $\frac{1}{10}$ or less) in a frequency range of 13.5 MHz to 310 MHz. In other words, it was confirmed that the negative impedance conversion circuit enables the impedance matching to be performed in a wide frequency band.

Next, a small plasma processing apparatus including a high-frequency power supply circuit having a structure shown in FIG. 8, which includes a plurality of negative impedance conversion circuits, each using an operational amplifier as a negative impedance portion, and further includes a step-up transformer as a booster, was prepared, and a plasma ignition test was performed. As a result, the ignition of the plasma was achieved.

Figure 19:
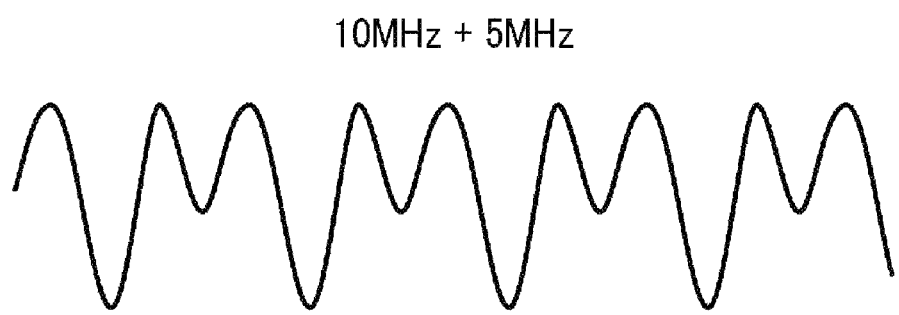
FIG. 19 is a diagram illustrating a voltage waveform obtained when two frequencies of 10 MHz and 5 MHz are superimposed.

Next, the negative impedance conversion circuit using the operational amplifier as the negative impedance portion was used to perform a plasma ignition test in a state where a frequency of 10 MHz and a frequency of 5 MHz to 15 MHz of the high-frequency power were superimposed. As a result, the ignition of the plasma was achieved. FIG. 19 shows a voltage waveform obtained when two frequencies of 10 MHz and 5 MHz are superimposed. As shown in FIG. 19, no distortion was observed in the voltage waveform obtained when the plasma was generated by superimposing two frequencies. From this, it was predicted that even if the load is plasma, the impedance matching can be performed for a plurality of frequencies by using a negative impedance conversion circuit as a matching device.

It should be noted that the embodiments of the present disclosure are illustrative in all respects and are not restrictive. The above-described embodiments may be omitted, replaced, or changed in various forms without departing from the scope of the appended claims and the gist thereof.

For example, in the above embodiments, an example of applying the high-frequency power to the upper electrode has been described. However, the present disclosure is not limited thereto, and the high-frequency power may be applied to the lower electrode or may be applied to both the upper electrode and the lower electrode.

Further, in the above embodiments, the case using capacitively coupled plasma as plasma has been described. However, the present disclosure is not limited thereto, and another plasma such as inductively coupled plasma, microwave plasma, or the like may be used.

DESCRIPTION OF REFERENCE NUMERALS

1: processing container (chamber)
2: substrate support (lower electrode)
10: shower head (upper electrode)
20: gas supply part
30, 30a to 30c: high-frequency power supply
40, 40a, 40b, 40c, 40d, 40e, 40f: high-frequency power conversion circuit
42: negative impedance portion (negative impedance conversion circuit)
44: operational amplifier
100, 100a, 100b, 100c, 100d, 100e, 100f: plasma processing apparatus
W: substrate

The invention claimed is:

1. A plasma processing apparatus for performing plasma processing on a substrate, comprising:
a processing container accommodating the substrate;
an electrode to which a high-frequency power for generating plasma in the processing container is applied;
a high-frequency power supply configured to apply the high-frequency power to the electrode; and
a high-frequency power supply circuit configured to supply the high-frequency power from the high-frequency power supply to the electrode,
wherein the high-frequency power supply circuit comprises:
a power supply path configured to supply a power from the high-frequency power supply to the electrode; and
a matching device configured to match a high-frequency power supply-side impedance with a plasma-side impedance, the matching device comprising a negative impedance portion that is connected to the power supply path and realizes a negative impedance corresponding to a plasma-side impedance.

2. The plasma processing apparatus of claim 1, wherein the negative impedance portion is formed of a negative impedance conversion circuit or a metamaterial.

3. The plasma processing apparatus of claim 2, wherein the negative impedance conversion circuit has an operational amplifier.

4. The plasma processing apparatus of claim 3, wherein an output stage of the operational amplifier has a plurality of transistors for outputting a voltage at which the plasma is ignited.

5. The plasma processing apparatus of claim 3, wherein the negative impedance conversion circuit further comprises:
a booster circuit disposed at a subsequent stage of the operational amplifier and configured to output a voltage at which the plasma is ignited.

6. The plasma processing apparatus of claim 1, wherein the matching device comprises a plurality of the negative impedance portions.

7. The plasma processing apparatus of claim 6, wherein the high-frequency power supply circuit further comprises:
a combiner configured to combine outputs of the plurality of negative impedance portions.

8. The plasma processing apparatus of claim 1, wherein the high-frequency power supply circuit further comprises:
a booster configured to boost an output of the negative impedance portion or an amplifier configured to amplify an output of the negative impedance portion.

9. The plasma processing apparatus of claim 1, wherein the matching device further comprises:
an impedance adjustment part connected to the negative impedance portion and configured to adjust an impedance of the matching device.

10. The plasma processing apparatus of claim 9, wherein the impedance adjustment part has a variable reactance circuit having a variable capacitor and/or a variable coil.

11. The plasma processing apparatus of claim 9, wherein the impedance adjustment part has a plasma generation part configured to generate plasma using a same recipe as used when the plasma is generated in the processing container.

12. The plasma processing apparatus of claim 9, wherein the impedance adjustment part has an impedance mirroring circuit having an active element and is configured to adjust an impedance to realize a same impedance as the impedance of the plasma in the processing container.

13. A high-frequency power supply circuit that supplies a high-frequency power to an electrode for generating plasma from a high-frequency power supply, comprising:
a power supply path that supplies a power from the high-frequency power supply to the electrode; and
a matching device that comprises a negative impedance portion connected to the power supply path and configured to realize a negative impedance corresponding to a plasma-side impedance, and matches a high-frequency power supply-side impedance with the plasma-side impedance.

14. The high-frequency power supply circuit of claim 13, wherein the negative impedance portion is a negative impedance conversion circuit or a metamaterial having a negative impedance.

15. The high-frequency power supply circuit of claim 14, wherein the negative impedance conversion circuit has an operational amplifier.

16. The plasma processing apparatus of claim 13, wherein the matching device has a plurality of negative impedance portions.

17. The high-frequency power supply circuit of claim 13, further comprising:
a booster configured to boost an output of the negative impedance portion or an amplifier configured to amplify an output of the negative impedance portion.

18. The high-frequency power supply circuit of claim 13, wherein the matching device further comprises:
an impedance adjustment part connected to the negative impedance portion and configured to adjust an impedance of the matching device.

19. An impedance matching method performed when plasma is generated by supplying a high-frequency power, comprising:
supplying a high-frequency power for plasma generation from a high-frequency power supply to an electrode through a power supply path; and
matching a high-frequency power supply-side plasma with a plasma-side impedance using a matching device comprising a negative impedance portion connected to the power supply path and configured to realize a negative impedance corresponding to the plasma-side impedance.

20. The impedance matching method of claim 19, wherein the negative impedance portion is formed of a negative impedance conversion circuit or a metamaterial having a negative impedance.

* * * * *